United States Patent
Kobayashi et al.

(10) Patent No.: US 9,967,492 B2
(45) Date of Patent: May 8, 2018

(54) IMAGING APPARATUS, IMAGING SYSTEM, AND DRIVING METHOD FOR IMAGING APPARATUS HAVING SIGNAL LINES EXTENDING IN COLUMN DIRECTION

(71) Applicant: CANON KABUSHIKI KAISHA, Tokyo (JP)

(72) Inventors: Daisuke Kobayashi, Kawaguchi (JP); Tomoya Onishi, Ayase (JP); Takeru Ohya, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 114 days.

(21) Appl. No.: 14/255,836

(22) Filed: Apr. 17, 2014

(65) Prior Publication Data

US 2014/0320714 A1    Oct. 30, 2014

(30) Foreign Application Priority Data

Apr. 24, 2013  (JP) ................................. 2013-091427

(51) Int. Cl.
| | | |
|---|---|---|
| *H04N 5/3745* | (2011.01) | |
| *H04N 5/335* | (2011.01) | |
| *H01L 27/146* | (2006.01) | |

(52) U.S. Cl.
CPC ....... *H04N 5/37455* (2013.01); *H04N 5/3355* (2013.01); *H01L 27/14603* (2013.01)

(58) Field of Classification Search
None
See application file for complete search history.

(56) References Cited

U.S. PATENT DOCUMENTS

| | | | | |
|---|---|---|---|---|
| 5,614,744 A | * | 3/1997 | Merrill | H01L 27/14643 257/291 |
| 6,757,018 B1 | * | 6/2004 | Fowler | H04N 3/155 348/229.1 |
| 2005/0104983 A1 | * | 5/2005 | Raynor | H04N 5/3575 348/294 |
| 2006/0132633 A1 | * | 6/2006 | Nam | H01L 27/14603 348/308 |

OTHER PUBLICATIONS

Kleinfelder et al., "A 10000 Frames/s CMOS Digital Pixel Sensor," IEEE Journal of Solid State Circuits, vol. 36, No. 12, Dec. 2001.*
Stuart Kleinfelder et al. "A 10000 Frames/s CMOS Digital Pixel Sensor;" IEEE Journal of Solid-State Circuits, Dec. 2001, vol. 36, No. 12, pp. 2049-2059.

* cited by examiner

*Primary Examiner* — Dennis Hogue
(74) *Attorney, Agent, or Firm* — Canon U.S.A., Inc. IP Division

(57) ABSTRACT

A pixel array has a plurality of output units arranged in matrix form and a plurality of A/D conversion units corresponds to the output units. Each of the output units outputs an electric signal based on incident electromagnetic waves. Each of the A/D conversion units converts the electric signal input from the corresponding output unit to a digital signal. A plurality of storage units corresponds to columns of the output units. Each of the storage units holds the corresponding digital signal. A first signal line is configured to supply a driving bias to at least one of the output units and the A/D conversion units. A second signal line is configured to transmit the digital signal from the A/D conversion units to the storage units. The output units are provided between the first signal line and the second signal line.

25 Claims, 12 Drawing Sheets

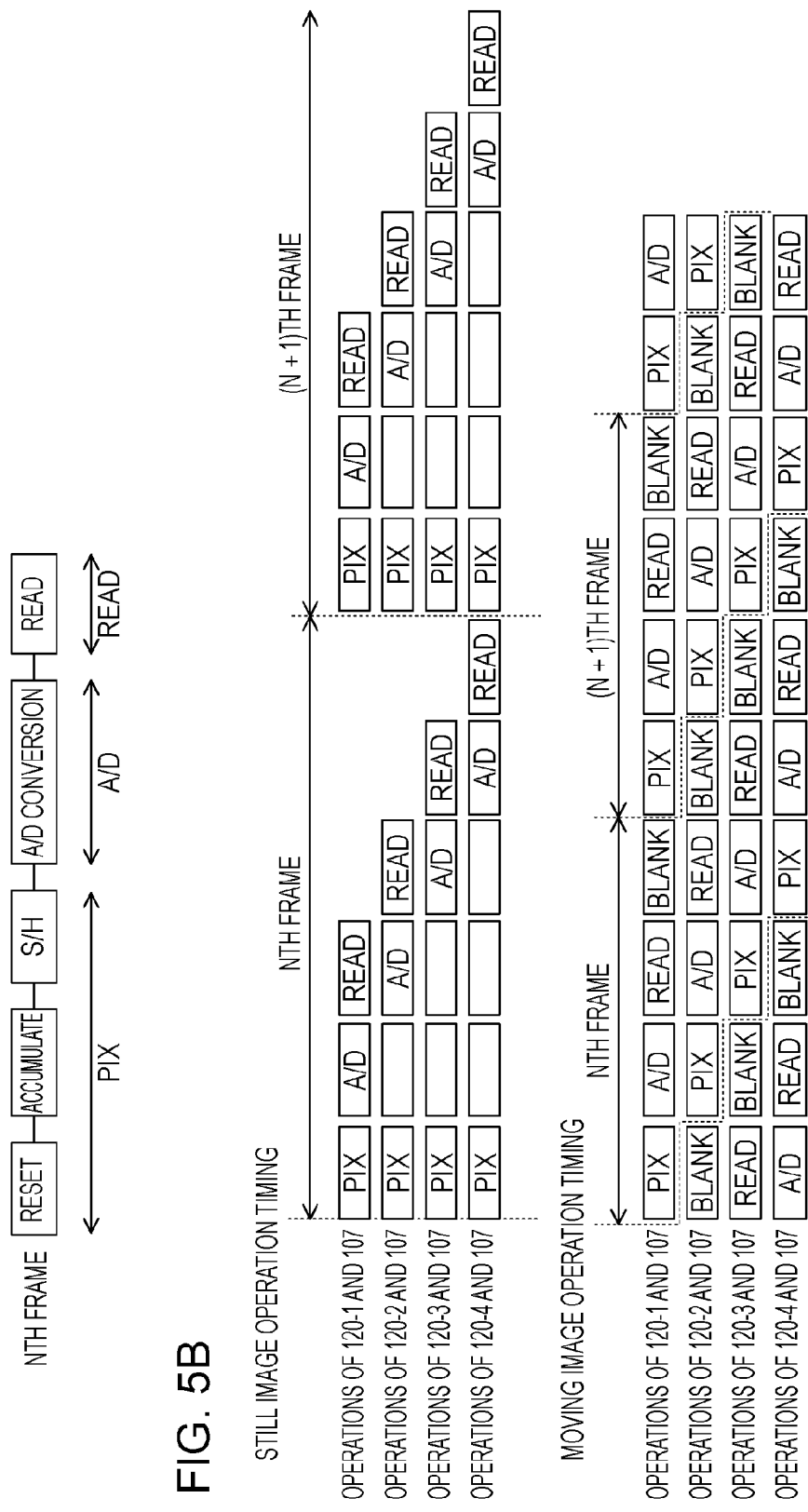

IMAGING APPARATUS, IMAGING SYSTEM, AND DRIVING METHOD FOR IMAGING APPARATUS HAVING SIGNAL LINES EXTENDING IN COLUMN DIRECTION

BACKGROUND OF THE INVENTION

Field of the Invention

One disclosed aspect of the embodiments relates to an imaging apparatus which converts incident electromagnetic waves to electric charges, an imaging system, and a driving method for an imaging apparatus.

Description of the Related Art

An imaging apparatus has been known which converts incident electromagnetic waves to electric charges. Stuart Kleinfelder, SukHwan Lim, Xinqiao Liu, and Abbas El Gamal, "A 10000 Frames/s CMOS Digital Pixel Sensor", IEEE JOURNAL OF SOLID-STATE CIRCUITS, DECEMBER 1501, VOL. 36, NO. 12, p. 2049-2059 discloses an example of such an imaging apparatus including pixels each having a photoelectric conversion unit configured to perform photoelectric conversion on incident light, and an A/D conversion unit configured to convert an analog signal output from the photoelectric conversion unit to a digital signal.

SUMMARY OF THE INVENTION

According to an aspect of the embodiments, there is provided an imaging apparatus including a pixel array having a plurality of electric signal output units arranged in matrix form and a plurality of A/D conversion units provided correspondingly to the electric signal output units, each of the electric signal output units outputting an electric signal based on incident electromagnetic waves, each of the A/D conversion units converting the electric signal input from the corresponding electric signal output unit to a digital signal, a plurality of storage units provided correspondingly to columns of the electric signal output units, each of the storage units holding the corresponding digital signal, a first signal line configured to supply a driving bias to at least one of the electric signal output units and the A/D conversion units, and a second signal line configured to transmit the digital signal from the A/D conversion units to the storage units, wherein the electric signal output units are provided between the first signal line and the second signal line.

According to another aspect of the embodiments, there is provided an imaging system including the imaging apparatus according to the above mentioned aspect and a signal processing unit configured to receive signals output from the imaging apparatus.

According to another aspect of the embodiments, there is provided a driving method for an imaging apparatus, in which the imaging apparatus includes a pixel array having a plurality of electric signal output units arranged in matrix form and a plurality of A/D conversion units provided correspondingly to the electric signal output units, each of the electric signal output units outputting an electric signal based on incident electromagnetic waves, each of the A/D conversion units converting the electric signal input from the corresponding electric signal output unit to a digital signal; a plurality of storage units provided correspondingly to columns of the electric signal output units, each of the storage units holding the corresponding digital signal; a first signal line configured to supply a driving bias to at least one of the electric signal output units and the A/D conversion units; and a second signal line configured to transmit the digital signal from the A/D conversion units to the storage units; the pixel array has a plurality of amplifiers each of which outputs a signal generated by amplifying the electric signal to the corresponding A/D conversion unit; the electric signal output units are provided between the first signal line and the second signal line; and the amplifiers are provided correspondingly to the A/D conversion units, the driving method including amplifying the electric signal of one of the electric signal output units by the amplifier during an period when one of the A/D conversion units is performing A/D conversion on a signal generated by amplifying the electric signal of another one of the electric signal output units.

Further features of the disclosure will become apparent from the following description of exemplary embodiments with reference to the attached drawings.

BRIEF DESCRIPTION OF THE DRAWINGS

FIG. 5A is a timing chart illustrating another example of an operation of the imaging apparatus.
FIG. 5B is a timing chart illustrating another example of an operation of the imaging apparatus.

DESCRIPTION OF THE EMBODIMENTS

In the imaging apparatus disclosed in "A 10000 Frames/s CMOS Digital Pixel Sensor", a case may be assumed where a digital signal line configured to transmit digital signals to be input to pixels or output from pixels is disposed in vicinity of an analog signal line configured to supply a potential to a photoelectric conversion unit and an A/D conversion unit. In this case, the potential of the analog signal line may change due to the potential of digital signals transmitted by the digital signal line. The changes of the potential of the analog signal line may deteriorate accuracy of A/D conversion. A technology of reducing deterioration of accuracy of A/D conversion will be described according to the following exemplary embodiments.

One disclosed feature of the embodiments may be described as a process which is usually depicted as a timing chart or diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

First Exemplary Embodiment

Figure 1A:
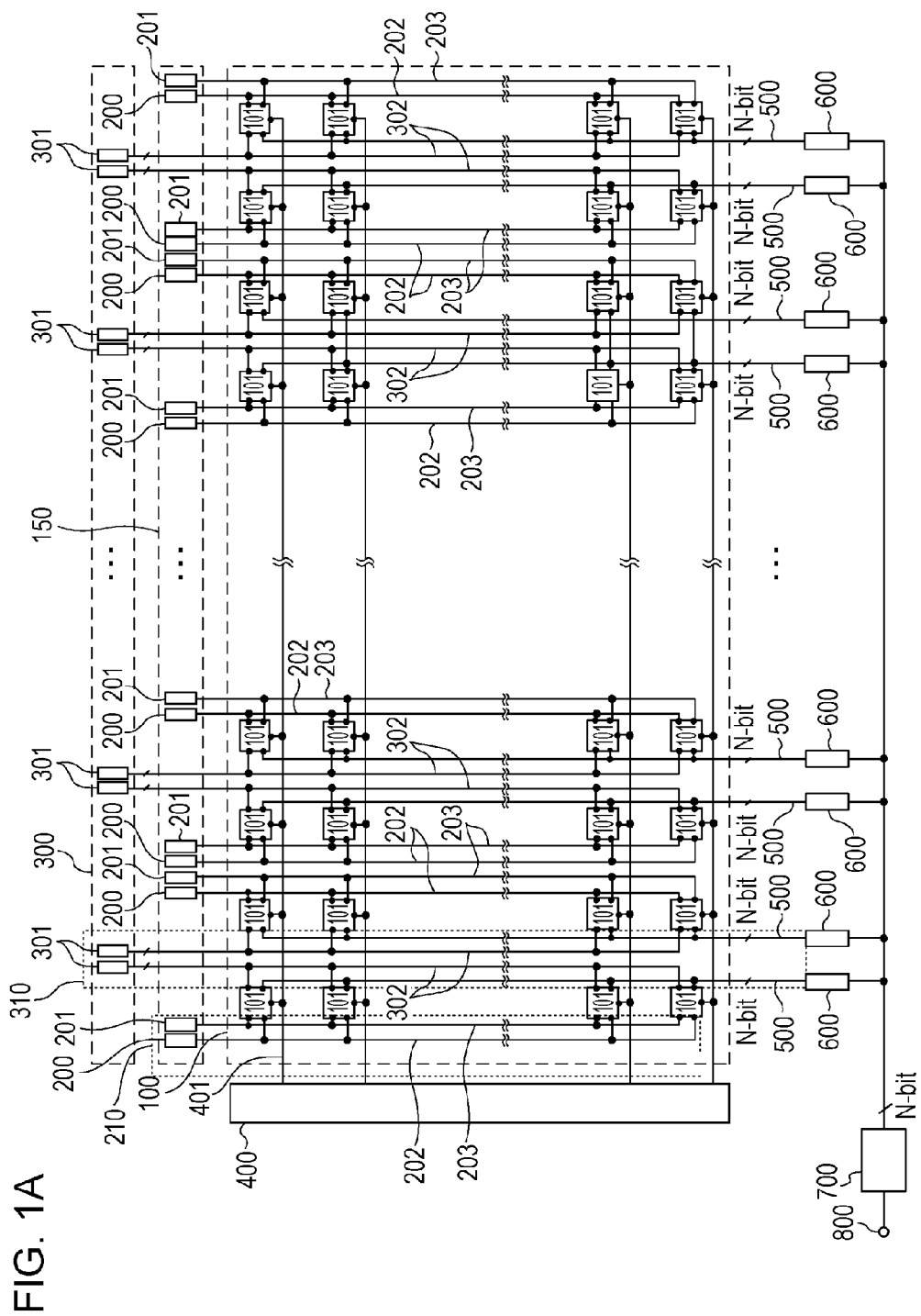
FIG. 1A is a schematic diagram illustrating an example of an imaging apparatus.

FIG. 1A illustrates a configuration example of an imaging apparatus according to a first exemplary embodiment.

A pixel array 100 in FIG. 1A has pixel output circuits 101 provided in matrix form. A driving bias group 150 includes driving bias circuits 200 and ramp signal supply circuits 201 each configured to drive the corresponding pixel output circuit 101. According to this exemplary embodiment, each column has the driving bias circuit 200 and the ramp signal supply circuit 201. A driving bias line 202 provided of each column supplies a driving bias from the corresponding driving bias circuit 200 to the pixel output circuit 101 provided of the corresponding column. A plurality of driving biases may be supplied in voltage or current in accordance with the circuit blocks included in the pixel output circuit 101. A ramp signal line 203 provided at each column supplies a ramp signal from the corresponding ramp signal supply circuit 201 to the pixel output circuit 101 of each column. A counter group 300 includes counter circuits 301. Each of the counter circuits 301 generates a counter signal by counting clock signals supplied from a clock signal generation unit, not illustrated. The counter circuit 301 supplies the generated counter signal to the corresponding pixel output circuits 101. According to this exemplary embodiment, each column has the counter circuits 301. Through a counter signal line 302 common to the columns, an N-bit counter signal is supplied to the pixel output circuit 101 of each column. It should be noted that N counter signal lines 302 are provided correspondingly to N-bit. A vertical control circuit 400 controls an operation of the pixel output circuits 101 in rows. While one control signal line 401 configured to supply a control signal is illustrated for simplicity, a plurality of control signal lines 401 may be provided in accordance with a control method for a circuit to be driven or a selecting operation on the pixel output circuits 101. A digital signal is output from the pixel output circuits 101 to a digital memory 600 through a common output line 500. N common output lines 500 are provided for pixel output circuits 101 of one column for transmitting an N-bit digital signal. Digital data held in the digital memory 600 are transferred to an output unit 700. The output unit 700 has a parallel/serial conversion function (hereinafter, called a P/S conversion function). The output unit 700 converts an N-bit parallel digital signal transferred from the digital memory 600 to a serial digital signal. The output unit 700 outputs the converted serial N-bit digital signal to an output terminal 800. The output terminal 800 outputs the serial N-bit digital signal output from the output unit 700. The digital memory 600 is a storage unit configured to hold a digital signal transmitted through the common output line 500. While FIG. 1A does not illustrate the driving bias line 102 configured to supply driving biases to the electric signal output unit 10 and A/D conversion unit 107, the driving bias line 102 is provided in parallel with the driving bias line 202 within a region where the analog signal line group 210 is provided.

Figure 1B:
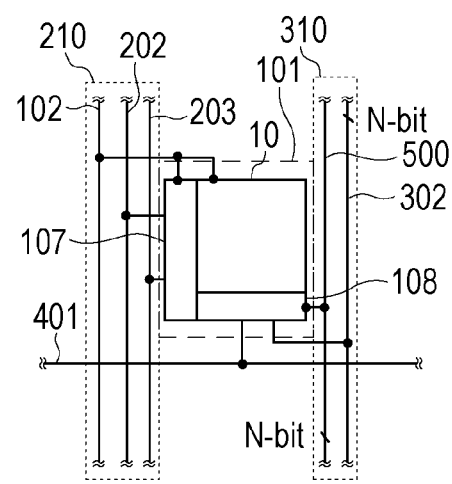
FIG. 1B is a schematic diagram illustrating an example of a pixel output circuit.

FIG. 1B is an arrangement example of a circuit block included in the pixel output circuit 101. The pixel output circuit 101 has an electric signal output unit 10, an A/D conversion unit 107, and an in-pixel memory 108. The driving bias line 102 supplies driving biases to the electric signal output unit 10 and the A/D conversion unit 107. The driving bias line 202 supplies a driving bias to the A/D conversion unit 107. The ramp signal line 203 supplies a ramp signal to the A/D conversion unit 107. A counter signal of the counter signal line 302 is output to the in-pixel memory 108. The in-pixel memory 108 holds a counter signal of a counted value at a time when the signal value of a latch signal output from the A/D conversion unit 107 changes. The held counter signal is a digital signal output from the pixel output circuit 101. The in-pixel memory 108 outputs the held digital signal to the common output line 500 on the basis of a control signal output from the control signal line 401. The digital signal line group 310 according to this exemplary embodiment includes the counter signal line 302 and the common output line 500. The analog signal line group 210 according to this exemplary embodiment includes the driving bias line 102 and 202 and the ramp signal line 203. The in-pixel memory 108 may have a Static Random Access Memory (SRAM) configuration, for example.

Figure 2A:
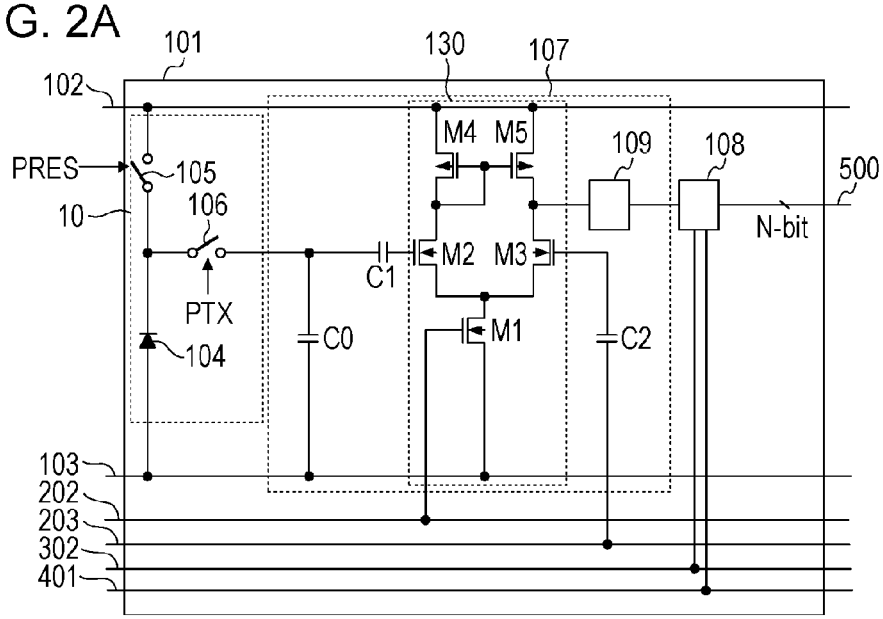
FIG. 2A is a schematic diagram illustrating an example of a pixel output circuit.

With reference to FIG. 2A, the electric signal output unit 10 and the A/D conversion unit 107 will be described. FIG. 2A illustrates an example of a configuration of the pixel output circuit 101. The electric signal output unit 10 has a photoelectric conversion unit 104, a switch 105, and a switch 106. The switch 105 switches between a conductive state and a non-conductive state of the driving bias line 102 and photoelectric conversion unit 104 on the basis of a signal value of a signal PRES output from the vertical control circuit 400. The switch 106 switches between a conductive state and a non-conductive state of the photoelectric conversion unit 104 and A/D conversion unit 107 on the basis of a signal value of a signal PTX output from the vertical control circuit 400. When the switch 106 is brought into a conductive state, a signal generated by performing photoelectric conversion on incident light is output from the photoelectric conversion unit 104 to the A/D conversion unit 107. Hereinafter, a signal generated by the photoelectric conversion unit 104 by performing photoelectric conversion on incident light will be called a photoelectric conversion signal. The photoelectric conversion unit 104 is a conversion unit configured to generate electric charges based on incident electromagnetic waves according to this exemplary embodiment.

The A/D conversion unit 107 has capacitative elements C0, C1, and C2, a comparator 130, and a latch unit 109. A photoelectric conversion signal output from the photoelectric conversion unit 104 is supplied to the capacitative elements C0 and C1. The capacitative element C0 receives a photoelectric conversion signal at its one node and receives a ground potential from the power supply line 103 at the other node. The comparator 130 has transistors M1, M2, M3, M4, and M5. The transistor M2 receives a photoelectric conversion signal at its input node through the capacitative element C1. On the other hand, the transistor M3 receives a ramp signal at its input node from the ramp signal line 203 through the capacitative element C2. The ramp signal is a signal having a potential that changes depending on time. The comparator 130 outputs to the latch unit 109 a comparison result signal indicative of a result of a comparison between a photoelectric conversion signal and a ramp signal. The driving bias line 202 supplies a driving bias to an input node of the transistor M1. The driving bias line 102 supplies a potential to one node of each of the transistors M4 and M5.

Figure 2B:
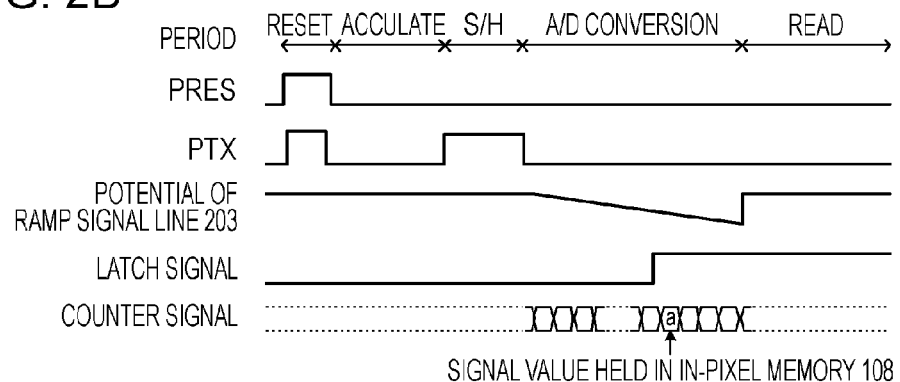
FIG. 2B is a timing chart for an example of an operation of the pixel output circuit.

FIG. 2B is a timing chart illustrating an example of an operation of the pixel output circuit 101 illustrated in FIG. 2A. In a reset period, the vertical control circuit 400 turns the signals PRES and PTX to a High level (hereinafter, called an H level). This brings the switches 105 and 106 into a conductive state. Thus, the potential of the photoelectric conversion unit 104 is reset. Bringing the switches 105 and 106 into a conductive state may also reset the potential of one node of each of the capacitative elements C0 and C1. The potentials of the input nodes of the transistors M2 and M3 are also reset by a reset circuit, not illustrated. The input node of the transistor M2 may be reset by establishing a short circuit between the input node of the transistor M2 and a node that is a drain of the transistor M2, for example. In the same manner, the input node of the transistor M3 may be reset by establishing a short circuit between the input node of the transistor M3 and a node that is a drain of the transistor M3.

When the vertical control circuit 400 turns the signals PRES and PTX to a Low level (hereinafter, called an L level), the photoelectric conversion unit 104 accumulates electric charges based on incident light. When an accumulation period in which the photoelectric conversion unit 104 accumulates electric charges, the vertical control circuit 400 turns the signal PTX to an H level. This causes the photoelectric conversion signal to be output to the capacitative elements C0 and C1. The photoelectric conversion signal is output to the input node of the transistor M2 through the capacitative element C1. After that, the vertical control circuit 400 turns the signal PTX to an L level. The period from an H level to an L level of the signal PTX corresponds to a sampling and holding period ("S/H" in FIG. 2B).

After the sampling and holding period, the ramp signal supply circuit 201 starts changing the potential of the ramp signal depending on time. When the comparator 130 changes the signal value of a comparison result signal to be output to the latch unit 109, the signal value of the latch signal to be output from the latch unit 109 to the in-pixel memory 108 is changed from an L level to an H level. The in-pixel memory 108 holds a counter signal ("a" in FIG. 2B) at a time when the signal value of the latch signal is changed from an L level to an H level. After that, the ramp signal supply circuit 201 finishes changing the potential of the ramp signal depending on time. The period when the ramp signal supply circuit 201 changes the potential of the ramp signal depending on time corresponds to an A/D conversion period. After the A/D conversion period ends, the vertical control circuit 400 changes the signal value of the control signal line 401 and causes the in-pixel memory 108 to output the digital signal held therein to the common output line 500. The period when the vertical control circuit 400 causes the pixel output circuits 101 to sequentially output digital signals to the common output line 500 corresponds to a read period.

Figure 2C:
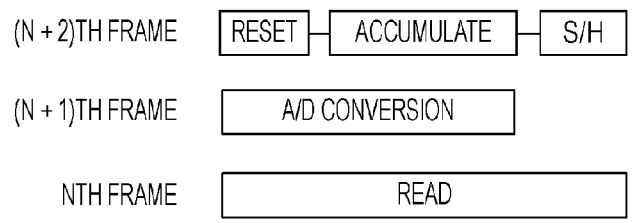
FIG. 2C is a timing chart illustrating an example of an operation of an imaging apparatus.

FIG. 2C illustrates driving timing for processing photoelectric conversion signals in different frames in parallel in the pixel output circuit 101. The reset, accumulation, S/H, A/D conversion, and read periods illustrated in FIG. 2C correspond to the periods illustrated in FIG. 2B. The operation illustrated in FIG. 2C has an overlap between a read period for the Nth frame and an A/D conversion period for the (N+1)th frame. The operation illustrated in FIG. 2C has an overlap between an A/D conversion period for the (N+1)th frame and a reset period and accumulation period for the (N+2)th frame. The operation illustrated in FIG. 2C is performed by the A/D conversion unit 107 and electric signal output unit 10 in parallel. Because the A/D conversion unit 107 is operating, the potentials of the counter signal line 302 of the digital signal line group 310 and the common output line 500 change.

In a case where the digital signal line group 310 and the analog signal line group 210 are provided closely, a change in one potential may change the other potential through a parasitic capacitance between the digital signal line group 310 and the analog signal line group 210. In particular, because the digital signal line group 310 changes its potential at a higher frequency than the analog signal line group 210, changes of the potential of the digital signal line group 310 may easily change the potential of the analog signal line group 210.

According to this exemplary embodiment, transmission of a digital signal may change the potentials of the driving bias lines 102 and 202 and ramp signal line 203. When the potentials of the driving bias lines 102 and 202 change, the amount of current fed to the transistor M1 of the comparator 130 changes, which may deteriorate accuracy of a comparison operation by the comparator 130. When the potential of the ramp signal line 203 changes, the linearity of a ramp signal decreases, which may deteriorate accuracy of a comparison operation by the comparator 130. Deterioration of accuracy of a comparison operation by the comparator 130 may further deteriorate accuracy of A/D conversion of the A/D conversion unit 107. Thus, changes in potentials of the driving bias lines 102 and 202 and ramp signal line 203 may deteriorate accuracy of an A/D conversion of the A/D conversion unit 107.

According to this exemplary embodiment, the electric signal output unit 10 is provided between the analog signal line group 210 including the driving bias lines 102 and 202 and the ramp signal line 203 and the digital signal line group 310 including the counter signal line 302 and the common output line 500. Thus, in the imaging apparatus of this exemplary embodiment, a potential change of the analog signal line group 210 due to a potential change of the digital signal line group 310 may not easily occur. Therefore, deterioration of accuracy of A/D conversion due to a potential change of the digital signal line group 310 may be reduced. The driving bias line 102 feeds reset voltage to the photoelectric conversion unit 104 and the capacitative elements C0 and C1. In the imaging apparatus according to this exemplary embodiment, because a potential change of the driving bias line 102 due to a potential change of the digital signal line group 310 may not easily occur, a change of the reset voltage for the photoelectric conversion unit 104 may be reduced.

According to this exemplary embodiment, the configuration has been described in which the electric signal output unit 10 is provided between the analog signal line group 210 including the driving bias lines 102 and 202 and the ramp signal line 203 and the digital signal line group 310 including the counter signal line 302 and the common output line 500. Without limiting to the configuration, this exemplary embodiment is applicable to a configuration in which the electric signal output unit 10 is provided between the driving bias line 102 or driving bias line 202 that is a first signal line and the common output line 500 that is a second signal line. According to this exemplary embodiment, the example has been described in which the analog signal line group 210 includes the driving bias lines 102 and 202 and the ramp signal line 203. However, the analog signal line group 210 may include another signal line and may further include the power supply line 103, for example. The power supply line 103 supplies power to the photoelectric conversion unit 104 and the capacitative element C0. Thus, a potential change of the power supply line 103 due to a potential change of the digital signal line group 310 may not easily occur, which may reduce a change of a photoelectric conversion signal. The analog signal line group 210 may include a bias line through which a potential is supplied to the in-pixel memory 108. In other words, the analog signal line group 210 may include signal lines through which a potential is supplied to the electric signal output unit 10, A/D conversion unit 107, and in-pixel memory 108.

According to this exemplary embodiment, the plurality of electric signal output units 10 are provided between the plurality of analog signal line groups 210, as illustrated in FIG. 1A. The digital signal line group 310 is provided between a plurality of electric signal output units 10 between a plurality of analog signal line groups 210. From a different point of view, a plurality of electric signal output units 10 are provided between a plurality of digital signal line groups 310. The analog signal line group 210 is provided between a plurality of electric signal output unit 10 between a plurality of digital signal line group 310.

According to this exemplary embodiment, the A/D conversion unit 107 and the electric signal output unit 10 operate in parallel, as illustrated in FIG. 2C. However, this exemplary embodiment is not limited to such a configuration.

While this exemplary embodiment has the digital memory 600 for each column, the digital memory 600 may be provided for each row.

According to this exemplary embodiment, the driving bias lines 102 and 202 and the ramp signal line 203 are electrically connected in common to the pixel output circuits 101 of one column. Alternatively, the driving bias lines 102 and 202 and the ramp signal line 203 may be electrically connected in common to the pixel output circuits 101 of one row.

While the counter circuit 301 is provided for each column according to this exemplary embodiment, one counter circuit 301 may be provided which is configured to output a common counter signal to all pixel output circuits 101. In this case, the in-pixel memory 108 may hold a signal value of a counter signal upon start of an A/D conversion period and a signal value of a counter signal upon change of a signal value of a latch signal. Then, one of the in-pixel memory 108, digital memory 600, and output unit 700 may acquire a signal indicative of a difference between a signal value of a counter signal upon start of an A/D conversion period and a signal value of a counter signal upon change of a signal value of a latch signal.

According to this exemplary embodiment, the potential of a ramp signal changes linearly. Alternatively, the potential of a ramp signal may change in step-like manner. A configuration in which the potential of a ramp signal changes in step-like manner is also included in the configuration in which a potential changes depending on time.

According to this exemplary embodiment, the A/D conversion unit 107 performs A/D conversion by using a ramp signal. Alternatively, this exemplary embodiment is also applicable to successive approximation type, pipeline type and other types of A/D conversion. For example, for successive approximation type A/D conversion, a signal line may be provided which supplies a reference potential for generating a photoelectric conversion signal and potentials subject to successive approximation, instead of the ramp signal line 203. In other words, this exemplary embodiment is applicable to a configuration including the digital signal line group 310 configured to transmit a digital signal, the electric signal output unit 10, and the analog signal line group 210 configured to supply a potential that drives the A/D conversion unit 107.

The photoelectric conversion unit 104 is an example of a conversion unit configured to generate electric charges based on incident electromagnetic waves. The conversion unit configured to generate electric charges based on incident electromagnetic waves may alternatively generate electric charges based on incident electromagnetic waves such as an X-ray and infrared radiation.

Second Exemplary Embodiment

An imaging apparatus according to a second exemplary embodiment will be described with a focus on differences from the first exemplary embodiment.

Figure 3A:
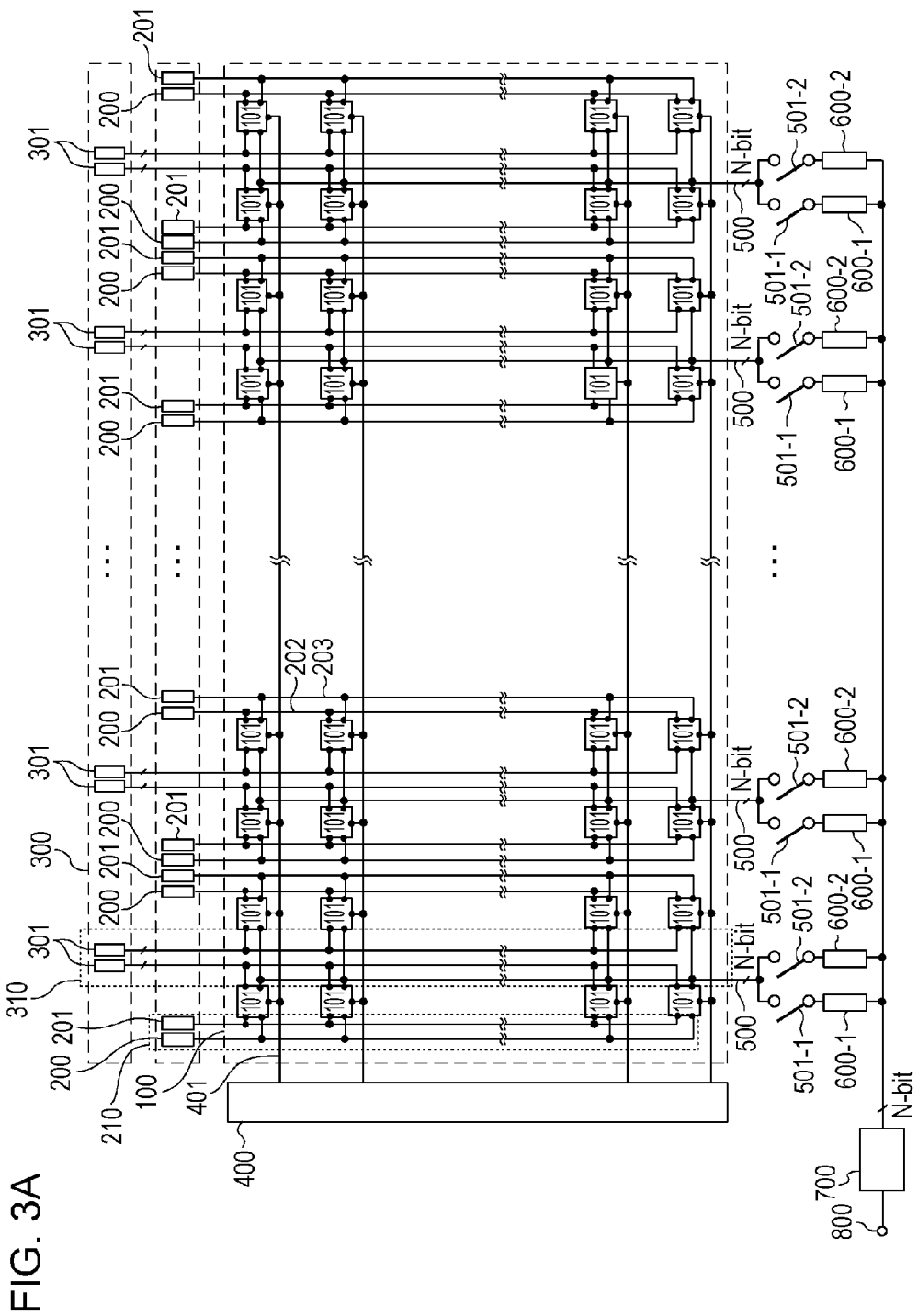
FIG. 3A is a schematic diagram illustrating another example of an imaging apparatus.

FIG. 3A illustrates a configuration example of an imaging apparatus according to this exemplary embodiment. The configuration illustrated in FIG. 3A is different from the configuration illustrated in FIG. 1A in that one common output line 500 is shared by pixel output circuits 101 of two adjacent columns.

Digital memories 600-1 and 600-2 are electrically connected to the common output line 500 through switches 501-1 and 501-2. A conductive state and a non-conductive state of the switches 501-1 and 501-2 are controlled by a control unit, not illustrated. The digital memories 600-1 and 600-2 hold digital signals output from the pixel output circuits 101 of columns. The digital memories 600-1 and 600-2 are provided correspondingly to columns of the pixel output circuits 101. The switches 501-1 and 501-2 correspond to a selection circuit configured to select one of the digital memories 600-1 and 600-2 as an output destination of a digital signal to be output to the common output line 500. The digital memory 600-1 is a first storage unit configured to hold digital signals based on pixel signals from the pixel output circuits 101 of one column. The digital memory 600-2 is a second storage unit configured to hold digital signals based on pixel signals from the pixel output circuits 101 of the other column.

Figure 3B:
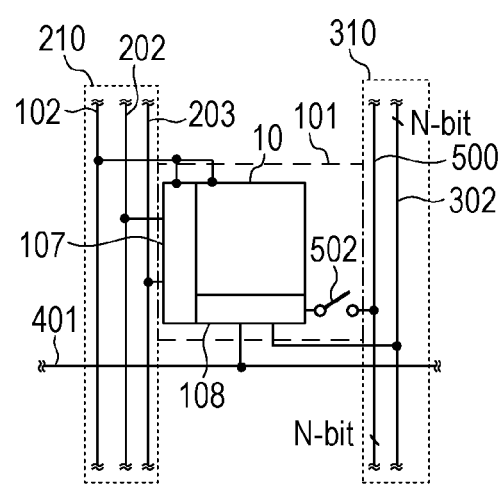
FIG. 3B is a schematic diagram illustrating another example of a pixel output circuit.

FIG. 3B illustrates an example of the pixel output circuit 101 according to this exemplary embodiment. The pixel output circuit 101 is different from the pixel output circuit 101 illustrated in FIG. 1B in that the pixel output circuit 101 in FIG. 3B has a switch 502 usable for switching between a conductive state and a non-conductive state of the in-pixel memory 108 and the common output line 500. The switch 502 switches between a conductive state and a non-conductive state on the basis of an instruction signal output from the vertical control circuit 400. The vertical control circuit 400 exclusively differentiates periods for bringing the switch 502 to a conductive state between the pixel output circuits 101 that share the common output line 500. Thus, digital signals are sequentially output from the pixel output circuits 101 of two columns to the common output line 500.

When the switch 502 in one of the pixel output circuits 101 that share the common output line 500 is brought into a conductive state, the control unit, not illustrated, brings the switch 501-1 into a conductive state. Thus, the digital memory 600-1 holds a digital signal of the one pixel output circuit 101 that shares the common output line 500. When the switch 502 in the other pixel output circuit 101 that shares the common output line 500 is brought into a conductive state, the control unit, not illustrated, brings the switch 501-2 into a conductive state. Thus, the digital memory 600-2 holds a digital signal of the other pixel output circuit 101 that shares the common output line 500.

According to this exemplary embodiment, the common output line 500 is shared by the pixel output circuits 101 of adjacent two columns. This may reduce the number of common output lines 500 to half of that of the configuration illustrated in FIG. 1A. The reduction of the number of the common output lines 500 may contribute to a higher aperture ratio of the photoelectric conversion unit 104 or may reduce the area of the pixel array 100. In particular, N common output lines 500 may be required to transmit an N-bit digital signal from the pixel output circuits 101 to the digital memory 600 in parallel. When one common output line 500 is shared by the pixel output circuits 101 of two columns as in this exemplary embodiment, the total number of the common output lines 500 may be reduced by N. According to this exemplary embodiment, one common output line 500 is shared by the pixel output circuit 101 of two columns. However, an embodiment is not limited to the configuration and is applicable to any configuration in which one common output line 500 is shared by pixel output circuits 101 of a plurality of columns.

It should be noted that the driving bias line 202, the ramp signal line 203, and the counter signal line 302 may be shared by adjacent columns to acquire the same advantage. On the other hand, the digital memory 600 externally provided to the pixel array 100 may be shared by adjacent columns. This may reduce the area of the region for the digital memory 600.

Third Exemplary Embodiment

An imaging apparatus according to a third exemplary embodiment will be described with a focus on differences from the first exemplary embodiment.

Figure 4A:
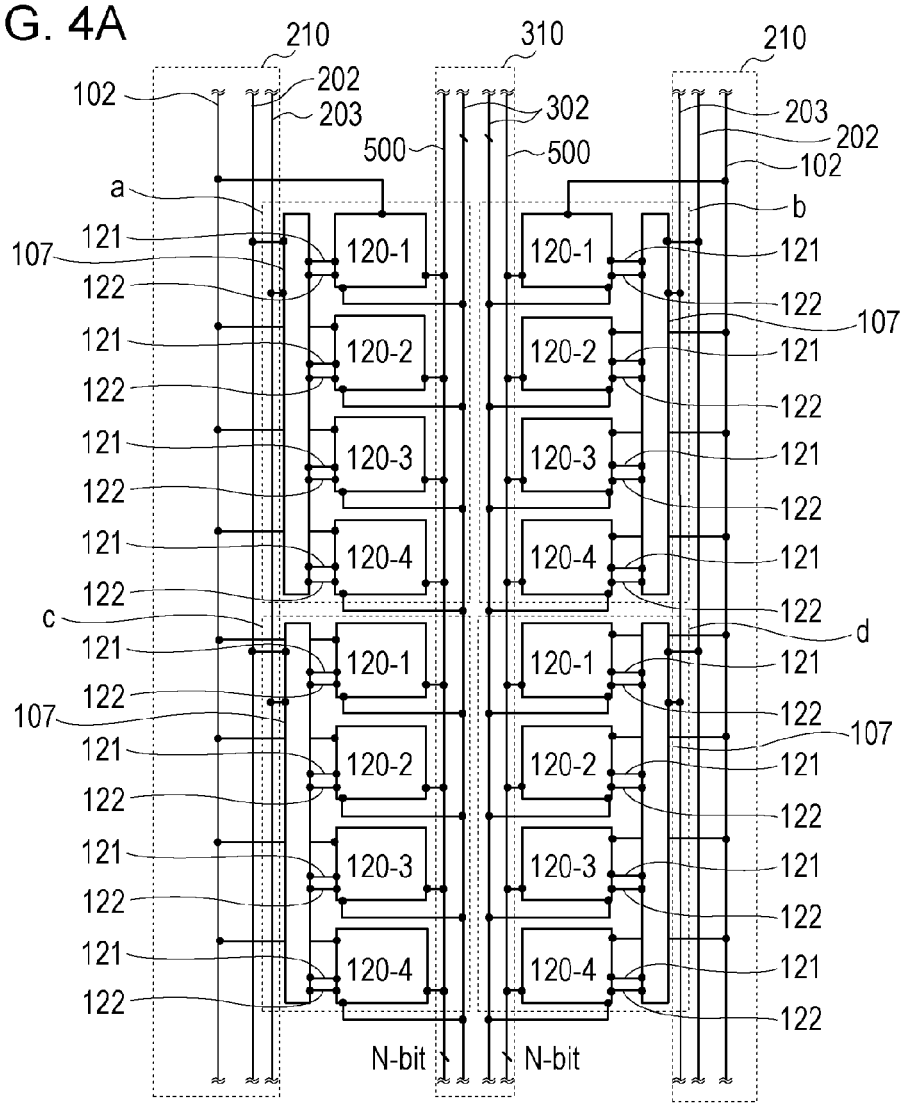
FIG. 4A is a schematic diagram illustrating another example of the imaging apparatus.

FIG. 4A illustrates a configuration example of an imaging apparatus according to this exemplary embodiment. The imaging apparatus illustrated in FIG. 4A is different from the imaging apparatus illustrated in FIG. 1A in that one A/D conversion unit 107 is shared by pixel output circuits 120 of four rows. Each of blocks a to d illustrated in FIG. 4A has four pixel output circuits 120 and one A/D conversion unit 107. The imaging apparatus in FIG. 4A has photoelectric conversion signal output lines 121 and latch signal lines 122 which electrically connect the A/D conversion units 107 and the pixel output circuits 120.

Figure 4B:
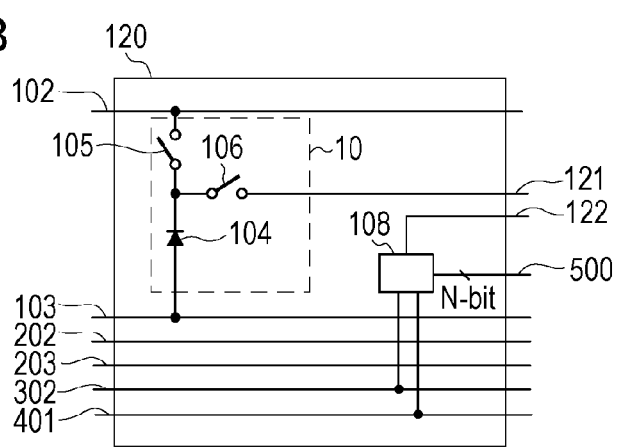
FIG. 4B is a schematic diagram illustrating another example of the pixel output circuit.

FIG. 4B illustrates a configuration example of the pixel output circuit 120 according to this exemplary embodiment. The A/D conversion unit 107 has the same configuration as that of the first exemplary embodiment. A latch signal output from the latch unit 109 is input to the pixel output circuits 120 through the latch signal line 122. When the switch 106 is brought into a conductive state, the photoelectric conversion signal is input to the A/D conversion unit 107 through the photoelectric conversion signal output line 121.

Next, with reference to FIGS. 5A and 5B, an operation of this exemplary embodiment will be described.

FIG. 5A illustrates operation examples of the imaging apparatus illustrated in FIG. 4A. The reset, accumulation, S/H, A/D conversion, and read periods illustrated in FIG. 5A correspond to the operations illustrated in FIG. 2B.

FIG. 5B illustrates operations of the pixel output circuits 120-1 to 120-4 in the block a that share one A/D conversion unit 107 and an operation of the A/D conversion unit 107 with respect to the operation timing for a still image and a moving image. In FIG. 5B, reset, accumulation, and S/H periods are indicated by Pix. Further in FIG. 5B, an A/D conversion period is indicated by A/D and a read period is indicated by Read.

In still-image operation timing, the imaging apparatus of this exemplary embodiment performs a global shutter operation in which accumulation periods of all of the pixel output circuits 120 occur simultaneously. In the operation illustrated in FIG. 5B, a start and an end of a Pix period including an accumulation period occur simultaneously in the pixel output circuits 120-1 to 120-4.

After the Pix period, the A/D conversion unit 107 performs A/D conversion on a photoelectric conversion signal of the pixel output circuit 120-1. During a read period after the A/D conversion, a digital signal based on the photoelectric conversion signal of the pixel output circuit 120-1, which is generated by the A/D conversion unit 107, is output to the common output line 500. During a read period for the digital signal based on the photoelectric conversion signal of the pixel output circuit 120-1, the A/D conversion unit 107 performs A/D conversion on a photoelectric conversion signal of the pixel output circuit 120-2. After that, in the same manner, the A/D conversion unit 107 performs A/D conversion on a photoelectric conversion signal of the pixel output circuit 120 of the (K+1)th row during a read period for a digital signal based on the photoelectric conversion signal of the pixel output circuit 120 of the Kth row.

While the imaging apparatus performs a global shutter operation in still-image operation timing, a rolling shutter operation is performed in moving-image operation timing. In other words, after the end of a Pix period of the pixel output circuit 120-1, a Pix period of the pixel output circuit 120-2 is started. In moving-image operation timing, a Blank period is provided after a read period for each of the pixel output circuits 120. During a Blank period, the electric signal output unit 10 and the in-pixel memory 108 do not operate. In moving-image operation timing, a Pix period for a next frame is provided after the Blank period.

According to this exemplary embodiment, one A/D conversion unit 107 is shared by four pixel output circuits 120. This may reduce the area of the A/D conversion unit 107.

Also in this exemplary embodiment, the electric signal output unit 10 is provided between the digital signal line group 310 and the analog signal line group 210, like the first exemplary embodiment. This may provide the same effect as that of the first exemplary embodiment.

According to this exemplary embodiment, one A/D conversion unit 107 is shared by four pixel output circuits 120. However, this exemplary embodiment is not limited to the configuration and is applicable to any configuration in which one A/D conversion unit 107 is shared by a plurality of pixel output circuits 120.

According to this exemplary embodiment, the Pix period has an equal length to those of the A/D conversion period and Read period in the moving-image operation timing illustrated in FIG. 5C. This exemplary embodiment is not limited to the configuration but the Blank period may be reduced and the Pix period may be increased by the amount equal to the reduction.

Fourth Exemplary Embodiment

An imaging apparatus according to a fourth exemplary embodiment will be descried with a focus on differences from the first exemplary embodiment.

Figure 6A:
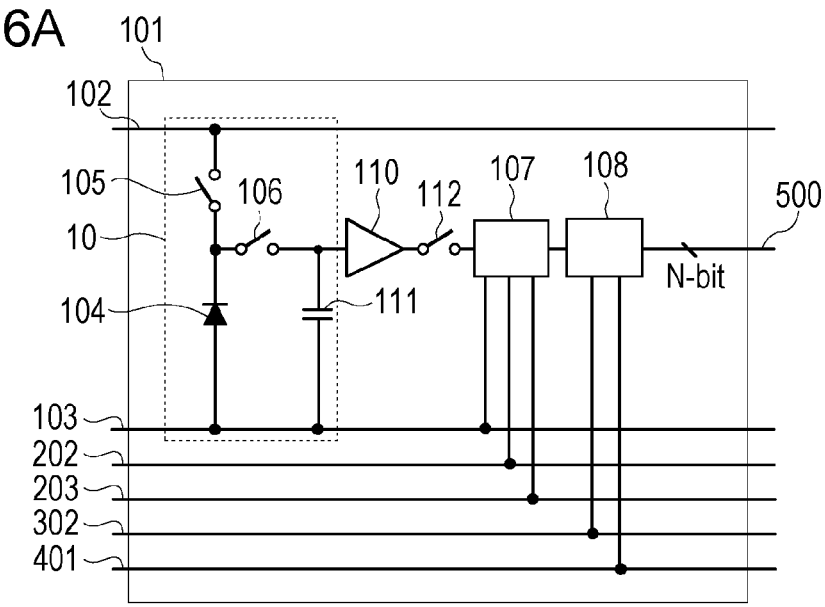
FIG. 6A is a schematic diagram illustrating another example of the pixel output circuit.

FIG. 6A illustrates a configuration example of a pixel output circuit 101 of this exemplary embodiment. The configuration illustrated in FIG. 6A is different from the configuration illustrated in FIG. 1A in that the pixel output circuit 101 has an amplifier 110.

According to this exemplary embodiment, a capacitative element 111 holds a photoelectric conversion signal. A photoelectric conversion signal held by the capacitative element 111 is input to the amplifier 110. The amplifier 110 outputs a signal generated by amplifying the photoelectric conversion signal to the A/D conversion unit 107 through a switch 112.

In some cases, a signal value of such a photoelectric conversion signal may be lower than a signal range on which A/D conversion may be performed. Even in such a case, the imaging apparatus of this exemplary embodiment may amplify such a photoelectric conversion signal by using the amplifier 110 so that the signal to be output to the A/D conversion unit 107 may fall within a signal range on which A/D conversion may be performed.

Also according to this exemplary embodiment, the arrangement of the digital signal line group 310 and the analog signal line group 210 may be the same as that of the first exemplary embodiment. Thus, the same effect as that of the first exemplary embodiment may be acquired.

Fifth Exemplary Embodiment

An imaging apparatus according to a fifth exemplary embodiment will be described with a focus on differences from the third exemplary embodiment.

Figure 6B:
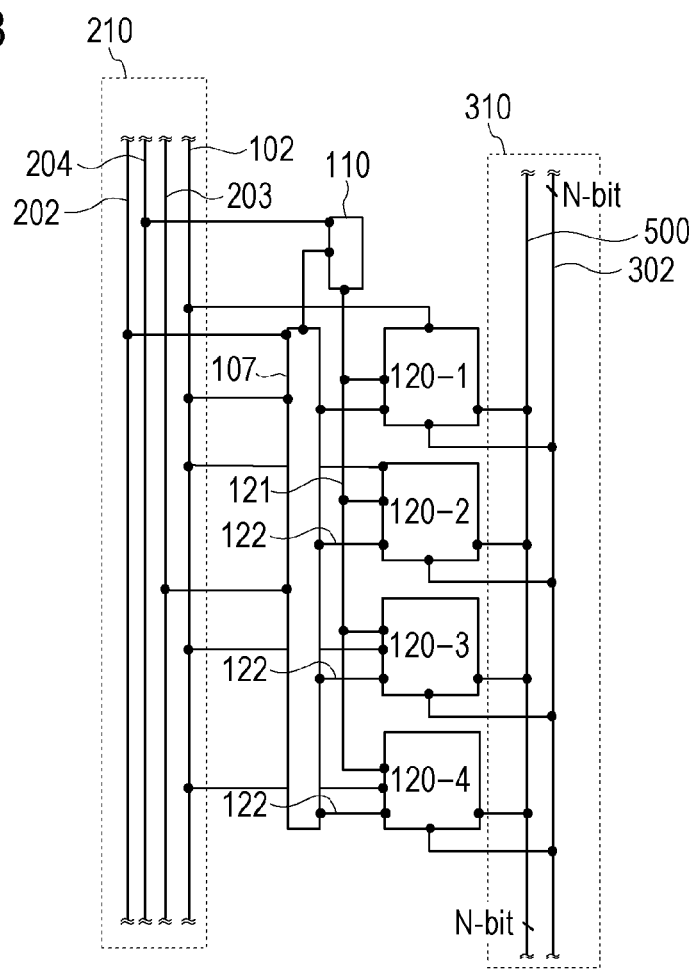
FIG. 6B is a schematic diagram illustrating another example of the imaging apparatus.

FIG. 6B illustrates a configuration example of an imaging apparatus according to this exemplary embodiment. In the imaging apparatus illustrated in FIG. 6B, an amplifier 110 is shared by four pixel output circuits 120. The amplifier 110 receives a driving bias for driving the amplifier 110 from a driving bias line 204. In the imaging apparatus according to this exemplary embodiment, the electric signal output unit 10 is provided between the driving bias line 204 and the digital signal line group 310. The configuration of the pixel output circuit 120 may be the same as the configuration illustrated in FIG. 4B.

Figure 7A:
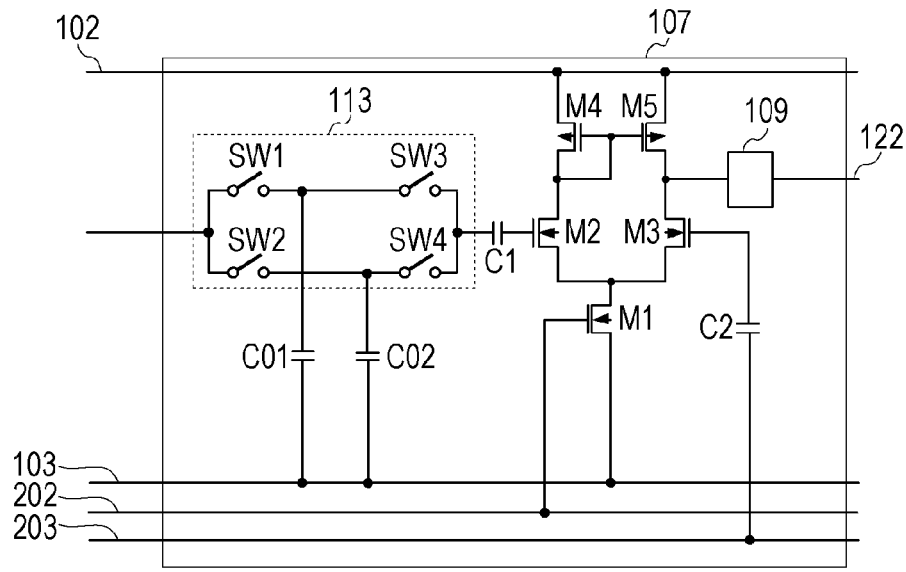
FIG. 7A is a schematic diagram illustrating an example of an A/D conversion unit.

FIG. 7A illustrates a configuration example of an A/D conversion unit 107 according to this exemplary embodiment. The A/D conversion unit 107 in FIG. 7A is different from that in FIG. 2A in that it has a switch group 113 and capacitative elements C01 and C02. The switch group 113 has switches SW1 to SW4. A signal output from the amplifier 110 is fed to the switches SW1 and SW2. When the switch SW1 is brought into a conductive state, the capacitative element C01 holds a signal output from the amplifier 110. When the switch SW2 is brought into a conductive state, the capacitative element C02 holds a signal output from the amplifier 110. When the switch SW3 is brought into a conductive state, the signal held by the capacitative element C01 is input to an input node of the transistor M2 through the capacitative element C1. When the switch SW4 is brought into a conductive state, the signal held by the capacitative element C02 is input to an input node of the transistor M2 through the capacitative element C1.

Figure 7B:
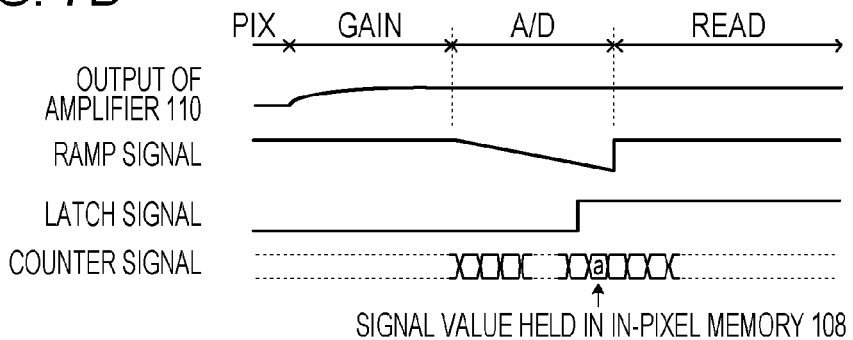
FIG. 7B is a timing chart illustrating another example of an operation of the imaging apparatus.

FIG. 7B illustrates an operation of one pixel output circuit 120 in the imaging apparatus illustrated in FIG. 6B. The Pix, A/D, and Read periods illustrated in FIG. 7B may be the same as the periods illustrated in FIG. 5A. During a Gain period, the amplifier 110 amplifies a photoelectric conversion signal and outputs a signal to the switch group 113.

Figure 7C:
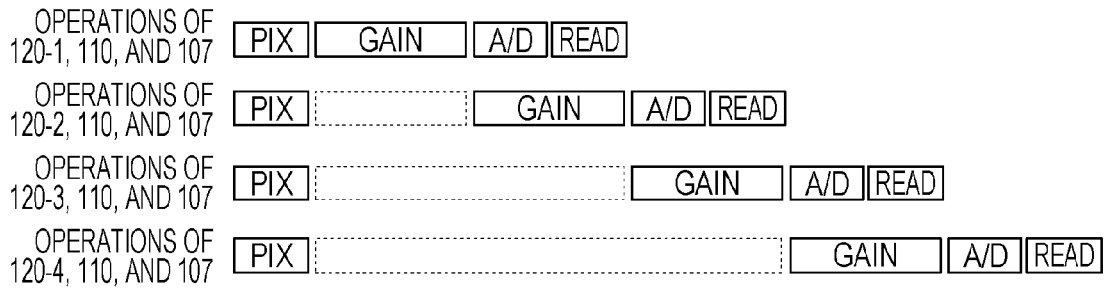
FIG. 7C is a timing chart illustrating another example of an operation of the imaging apparatus.

FIG. 7C is a timing chart for a still-image operation in the imaging apparatus illustrated in FIG. 6B. According to this exemplary embodiment, the period in which the amplifier 110 amplifies a photoelectric conversion signal (hereinafter, called a Gain period) is equal to a sum of an A/D conversion period and a Read period.

The imaging apparatus according to this exemplary embodiment performs global shutter operation, like the third exemplary embodiment. After Pix periods of the pixel output circuits 120-1 to 120-4, a Gain period is started in which the amplifier 110 amplifies a photoelectric conversion signal of the pixel output circuit 120-1. In the Gain period, the switch SW1 of the switch group 113 is brought into a conductive state, and the capacitative element C01 holds a signal output from the amplifier 110. In the A/D conversion period for a signal generated by amplifying the photoelectric conversion signal of the pixel output circuit 120-1, the switch SW1 is brought into a non-conductive state, and the switch SW3 is brought into a conductive state. Referring to the timing chart in FIG. 7C, the operation of the imaging apparatus has an overlap between the A/D conversion period on a signal based on the photoelectric conversion signal of the pixel output circuit 120-1 and for the Gain period for the photoelectric conversion signal of the pixel output circuit 120-2. In the Gain period for amplifying a photoelectric conversion signal of the pixel output circuit 120-2, the switch SW2 of the switch group 113 is brought into a conductive state, and the capacitative element C02 holds a signal output from the amplifier 110. In the A/D conversion period for a signal generated by amplifying a photoelectric conversion signal of the pixel output circuit 120-2, the switch SW2 is brought into a non-conductive state, and the switch SW4 is brought into a conductive state.

After that, in the same manner, there is an overlap between operations for the Gain period and the A/D conversion period on the photoelectric conversion signals of the pixel output circuits 120-3 and 120-4. Thus, digital signals based on photoelectric conversion signals from a plurality of pixel output circuits 120 may be generated in a shorter period than a case with no overlap between the operations of the amplifier 110 and A/D conversion unit 107.

Also in the imaging apparatus of this exemplary embodiment, the electric signal output unit 10 is provided between the digital signal line group 310 and the analog signal line group 210, like the configuration in FIG. 4A. This may provide the same effect as that of the first exemplary embodiment. Further, the electric signal output unit 10 is provided between the analog signal line group 210 including a driving bias line 204 that is a third signal line for driving the amplifier 110 and the digital signal line group 310. This is because when the driving bias line 204 is disposed in vicinity of the digital signal line group 310, a change in potential of the digital signal line group 310 may further change the potential of the driving bias line 204. A change in potential of the driving bias line 204 may further change the amplification ratio of the amplifier 110. Due to the change in amplification ratio of the amplifier 110, amplifying photoelectric conversion signals having an equal signal value may result in different signal values of signals output from the amplifier 110. Accordingly, in order to reduce a change in amplification ratio of the amplifier 110, the electric signal output unit 10 may be provided between the driving bias line 204 that drives the amplifier 110 and the digital signal line group 310.

According to this exemplary embodiment, the A/D conversion unit 107 has the switch group 113 and the capacitative elements C01 and C02. This may allow an overlap between an A/D conversion period for a signal generated by amplifying a photoelectric conversion signal of the pixel output circuit 120-1 and a Gain period for a photoelectric conversion signal of the pixel output circuit 120-2. Thus, the period for generating digital signals based on signals generated by amplifying photoelectric conversion signals of a plurality of pixel output circuits 120 may be shorter than a configuration in which the A/D conversion unit 107 does not have the switch group 113.

According to this exemplary embodiment, one amplifier 110 is shared by a plurality of pixel output circuits 120. This may contribute to reduction of the total circuit area of the pixel output circuits 120 and the amplifier 110 compared with a configuration in which each of the pixel output circuits 120 has the amplifier 110. On the other hand, the circuit area of the A/D conversion unit 107 is increased compared with the configuration illustrated in FIG. 4A because it has the switch group 113 and capacitative elements C01 and C02. Thus, when the circuit area of one amplifier 110 is larger than the total circuit area of the switch group 113 and capacitative elements C01 and C02, sharing one amplifier 110 by a plurality of pixel output circuits 120 may reduce the circuit area of the pixel array.

According to this exemplary embodiment, the amplifier 110 amplifies signals of the pixel output circuits 120 and outputs the resulting signals to the A/D conversion unit 107. Alternatively, the amplifier 110 may further have an addition function in its input unit to which a photoelectric conversion signal is input and may amplify a photoelectric conversion signal generated by adding photoelectric conversion signals from a plurality of pixel output circuits 120 and output it to the A/D conversion unit 107.

Having described according to this exemplary embodiment that a sum of an A/D conversion period and a Read period is equal to a Gain period, this exemplary embodiment is not limited to the configuration. For example, the bit count of a digital signal may be reduced in order to reduce the A/D conversion period. When digital signals are output in series from pixel output circuits, the Read period may be reduced by a reduced bit count of a digital signal.

It has been described according to this exemplary embodiment that one amplifier 110 is shared by four pixel output circuits 120. Alternatively, two pixel output circuits 120 may share one amplifier 110.

Figure 8A:
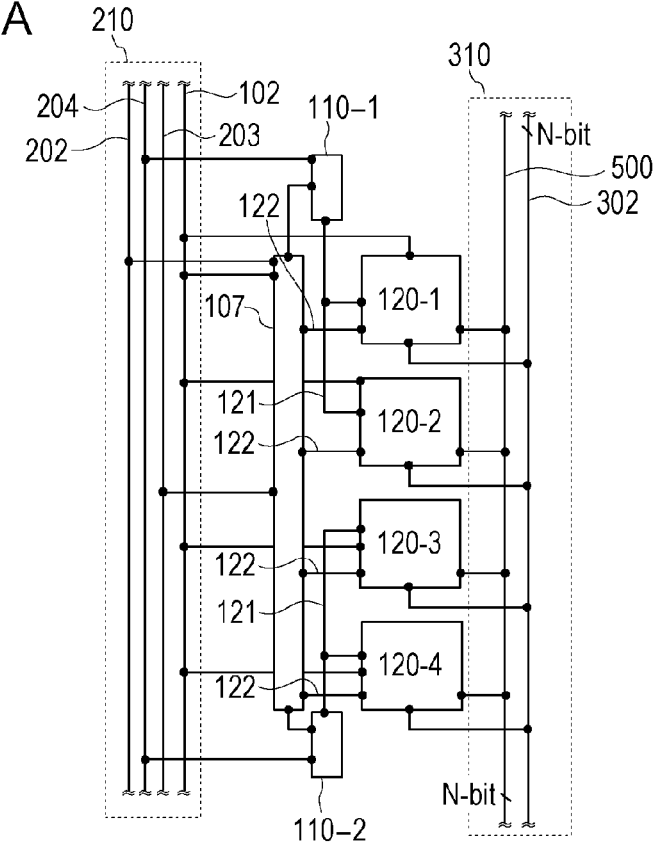
FIG. 8A is a schematic diagram illustrating another example of the imaging apparatus.

FIG. 8A illustrates a configuration in which two pixel output circuits 120 share one amplifier 110. Pixel output circuits 120-1 and 120-2 share an amplifier 110-1. Pixel output circuits 120-3 and 120-4 share an amplifier 110-2. Each of the amplifiers 110-1 and 110-2 outputs a signal generated by amplifying a photoelectric conversion signal output from the pixel output circuit 120 to the A/D conversion unit 107. The amplifiers 110-1 and 110-2 receive a driving bias from a common driving bias line 204.

Figure 8B:
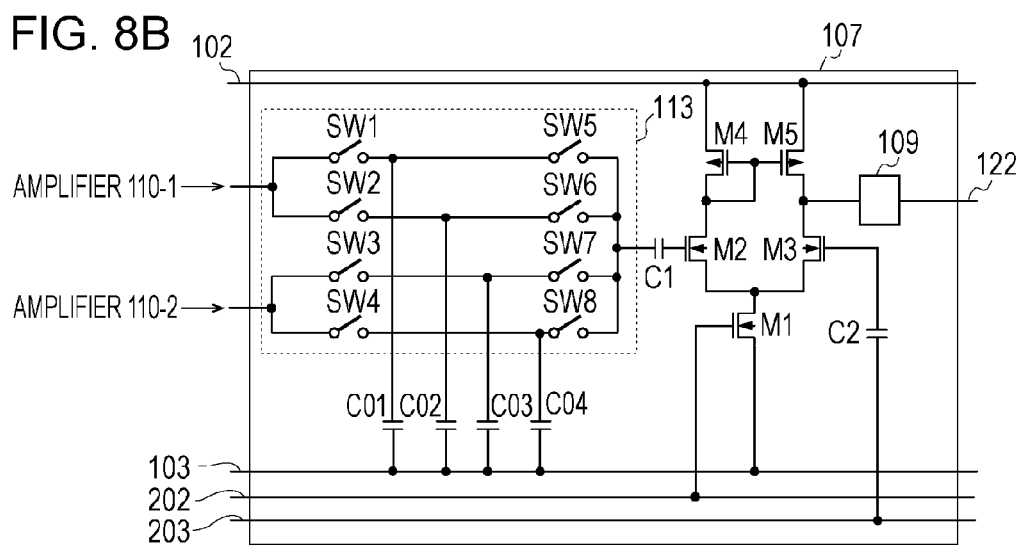
FIG. 8B is a schematic diagram illustrating another example of the A/D conversion unit.

FIG. 8B illustrates a configuration example of the A/D conversion unit 107 in the imaging apparatus illustrated in FIG. 8A. The switch group 113 has switches SW1 to SW8. The A/D conversion unit 107 has capacitative elements C01 to C04. A signal output from the amplifier 110-1 is input to the switches SW1 and SW2. When a control unit, not illustrated, brings the switch SW1 into a conductive state, the capacitative element C01 holds a signal output from the amplifier 110-1. On the other hand, when the control unit, not illustrated, brings the switch SW2 into a conductive state, the capacitative element C02 holds a signal output from the amplifier 110-1. In the same manner, when the control unit, not illustrated, brings the switches SW3 and SW4 into a conductive state, the capacitative elements C03 and C04 hold a signal output from the amplifier 110-2.

When the control unit, not illustrated, brings the switch SW1 into a non-conductive state and the switch SW5 into a conductive state, a signal held by the capacitative element C01 is output to an input node of the transistor M2 through the switch SW5 and the capacitative element C1. The same is true for the other capacitative elements C02 to C04. The switches SW2 to SW4 corresponding to the capacitative elements C02 to C04, respectively, are brought into a non-conductive state, and the switches SW6 to SW8 corresponding to the capacitative elements C02 to C04, respectively, are brought into a conductive state. This causes signals held by the capacitative elements C02 to C04 to be output from the capacitative elements C02 to C04 to the transistor M2 through the capacitative element C1.

Figure 9A:
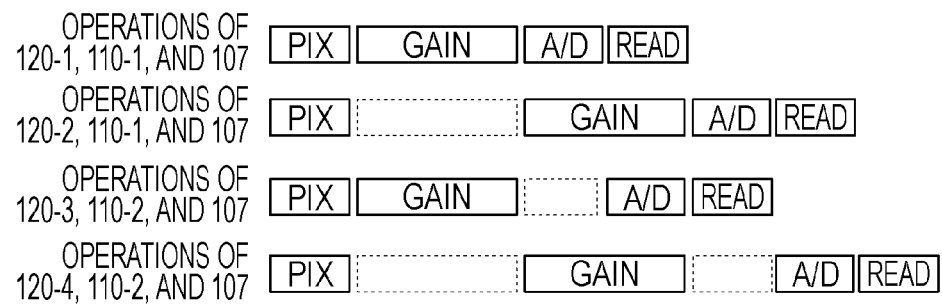
FIG. 9A is a timing chart illustrating an operation of another example of the imaging apparatus.

FIG. 9A illustrates an operation of an imaging apparatus illustrated in FIG. 8A. During the Pix periods of the pixel output circuits 120-1 to 120-4, the pixel output circuits 120-1 to 120-4 start and end simultaneously. The amplifier 110-1 outputs a signal generated by amplifying a photoelectric conversion signal of the pixel output circuit 120-1 to the capacitative element C01 through the switch SW1. The amplifier 110-2 outputs a signal generated by amplifying a photoelectric conversion signal of the pixel output circuit 120-2 to the capacitative element C03 through the switch SW3. A Gain period of the amplifier 110-1 starts and ends simultaneously with the start and end of a Gain period of the amplifier 110-2.

The control unit, not illustrated, brings the switches SW1 and SW3 into a non-conductive state and the switch SW5 into a conductive state. This causes the A/D conversion unit 107 to start A/D conversion on a signal generated by amplifying a photoelectric conversion signal of the pixel output circuit 120-1. On the other hand, the amplifier 110-1 outputs a signal generated by amplifying a photoelectric conversion signal of the pixel output circuit 120-2 to the capacitative element C02 through the switch SW2. The amplifier 110-2 outputs a signal generated by amplifying a photoelectric conversion signal of the pixel output circuit 120-4 to the capacitative element C04 through the switch SW4.

When the A/D conversion period for the signal generated by amplifying a photoelectric conversion signal of the pixel output circuit 120-1 ends, the control unit, not illustrated, brings the switch SW5 into a non-conductive state and the switch SW7 into a conductive state. This causes the A/D conversion unit 107 to start A/D conversion on a signal generated by amplifying a photoelectric conversion signal of the pixel output circuit 120-3.

In the imaging apparatus illustrated in FIG. 8A, an overlap is allowed between the Gain periods of the amplifiers 110-1 and 110-2. On the other hand, in the imaging apparatus illustrated in FIG. 6B, after the Gain period of the pixel output circuit 120-1 ends, the Gain period of the pixel output circuit 120-2 starts. Thus, in the imaging apparatus illustrated in FIG. 8A, the period of time required for amplifying photoelectric conversion signals of a plurality of pixel output circuits 120 may be reduced compared with the imaging apparatus illustrated in FIG. 6B.

In the imaging apparatus illustrated in FIG. 8A, the A/D conversion unit 107 has the switch group 113 having the switches SW1 to SW8 and the capacitative elements C01 to C04. Thus, among a plurality of pixel output circuits 120 that sequentially output photoelectric conversion signals to the same amplifier 110, an overlap is allowed between an A/D conversion period for a signal based on a photoelectric conversion signal of one pixel output circuit 120 and a Gain period for a photoelectric conversion signal of the other pixel output circuit 120. This is similar to that the imaging apparatus illustrated in FIG. 6B.

Also in the imaging apparatus illustrated in FIG. 8A, the electric signal output unit 10 is provided between the analog signal line group 210 and the digital signal line group 310. Therefore, the same effect as that of the first exemplary embodiment may be acquired.

Sixth Exemplary Embodiment

An imaging apparatus according to a sixth exemplary embodiment will be described with a focus on differences from the fifth exemplary embodiment.

Figure 9B:
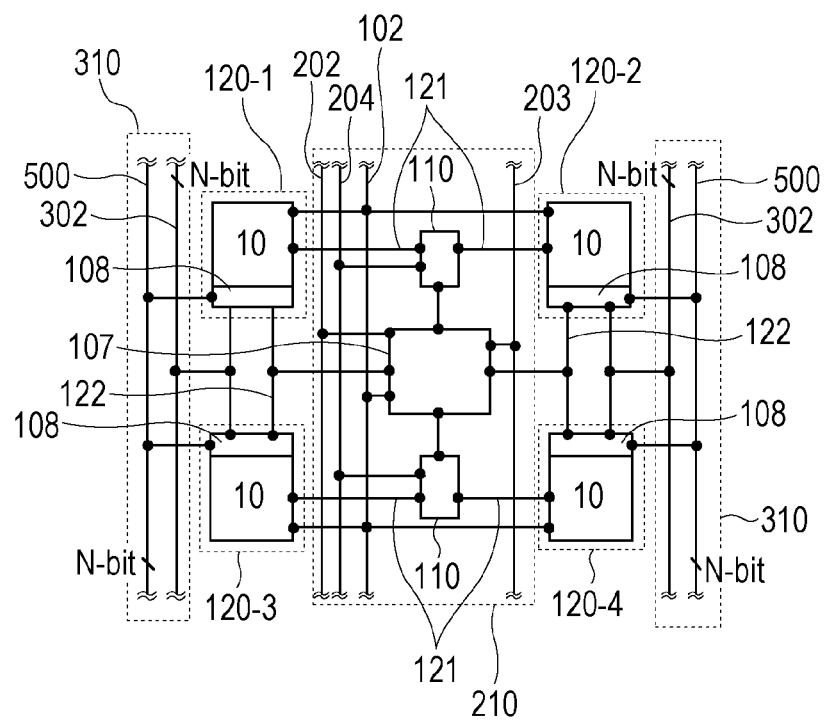
FIG. 9B is a schematic diagram illustrating another example of the imaging apparatus.

FIG. 9B illustrates a configuration example of an imaging apparatus according to this exemplary embodiment. In the imaging apparatus according to this exemplary embodiment, four pixel output circuit 120 of 2 rows and 2 columns share two amplifiers 110 and one A/D conversion unit 107, like the imaging apparatus illustrated in FIG. 8A. The imaging apparatus illustrated in FIG. 9B is different from the imaging apparatus illustrated in FIG. 8A in that the A/D conversion unit 107 and amplifiers 110 are shared by four pixel output circuits 120 of 2 rows and 2 columns.

Advantages of a case where four pixel output circuits 120 of 2 rows and 2 columns share the amplifiers 110 and A/D conversion unit 107 will be described. In the digital signal line group 310, N signal lines are provided for transmission of an N-bit digital signal in parallel. On the other hand, in the analog signal line group 210, one driving bias line is provided for the value of the potential to be supplied. Thus, the digital signal line group 310 tends to have more lines than those of the analog signal line group 210. Therefore, in the imaging apparatus in FIG. 4A, the width of the digital signal line group 310 corresponding to the pixel output circuits 120 of 2 columns tends to be longer than the width of the analog signal line group 210 corresponding to the pixel output circuits 120 of 2 columns. On the other hand, from viewpoint of optical characteristics, columns of the pixel output circuit 120 may preferably be provided at constant periods. Therefore, in some cases, a difference in length between the width of the digital signal line group 310 corresponding to the pixel output circuits 120 of 2 columns and the width of the analog signal line group 210 corresponding to the pixel output circuits 120 of 2 columns may a restriction on designing an imaging apparatus.

In the imaging apparatus in FIG. 9B, the amplifiers 110 and A/D conversion unit 107 are provided between a signal line group including driving bias lines 202 and 204 and a ramp signal line 203. The amplifiers 110 and A/D conversion unit 107 are provided within the region of the analog signal line group 210 having a shorter width than that of the digital signal line group 310. This may reduce the length difference between the width of the digital signal line group 310 and the analog signal line group 210 including the amplifiers 110 and A/D conversion unit 107. Thus, columns of the pixel output circuits 120 may be disposed more easily at constant column periods.

In the imaging apparatus in FIG. 9B, pixel output circuits 120 of adjacent rows are disposed such that the in-pixel memories 108 therein may face each other. Thus, the length of the latch signal line 122 that electrically connects the A/D conversion unit 107 and the in-pixel memories 108 in the pixel output circuits 120 of 2 rows may be shorter than that in a case where the pixel output circuit 120-3 has a same layout as that of the pixel output circuit 120-1. The electrical path between the counter signal line 302 and the in-pixel memories 108 of the pixel output circuits 120 of 2 rows may also be shorter than that in a case where the pixel output circuit 120-3 has a same layout as that of the pixel output circuit 120-1. Therefore, the imaging apparatus in FIG. 9B provides an effect that the circuit area of the pixel output circuits 120 of 2 rows and 2 columns may be reduced, compared with a case where the pixel output circuit 120-3 has a same layout as that of the pixel output circuit 120-1.

In the imaging apparatus in FIG. 9B, the amplifiers 110 and A/D conversion unit 107 are provided between the signal line group including the driving bias lines 202 and 204 and the ramp signal line 203 that is a fourth signal line. Thus, the imaging apparatus in FIG. 9B may provide an effect that the potential of the driving bias line 202 that does not easily change even when the potential of the ramp signal line 203 changes depending on time.

In the imaging apparatus in FIG. 9B, the amplifier 110 may further have an addition function in its input unit so that the photoelectric conversion signals of the pixel output circuits 120 of adjacent 2 columns may be added.

Seventh Exemplary Embodiment

Figure 10:
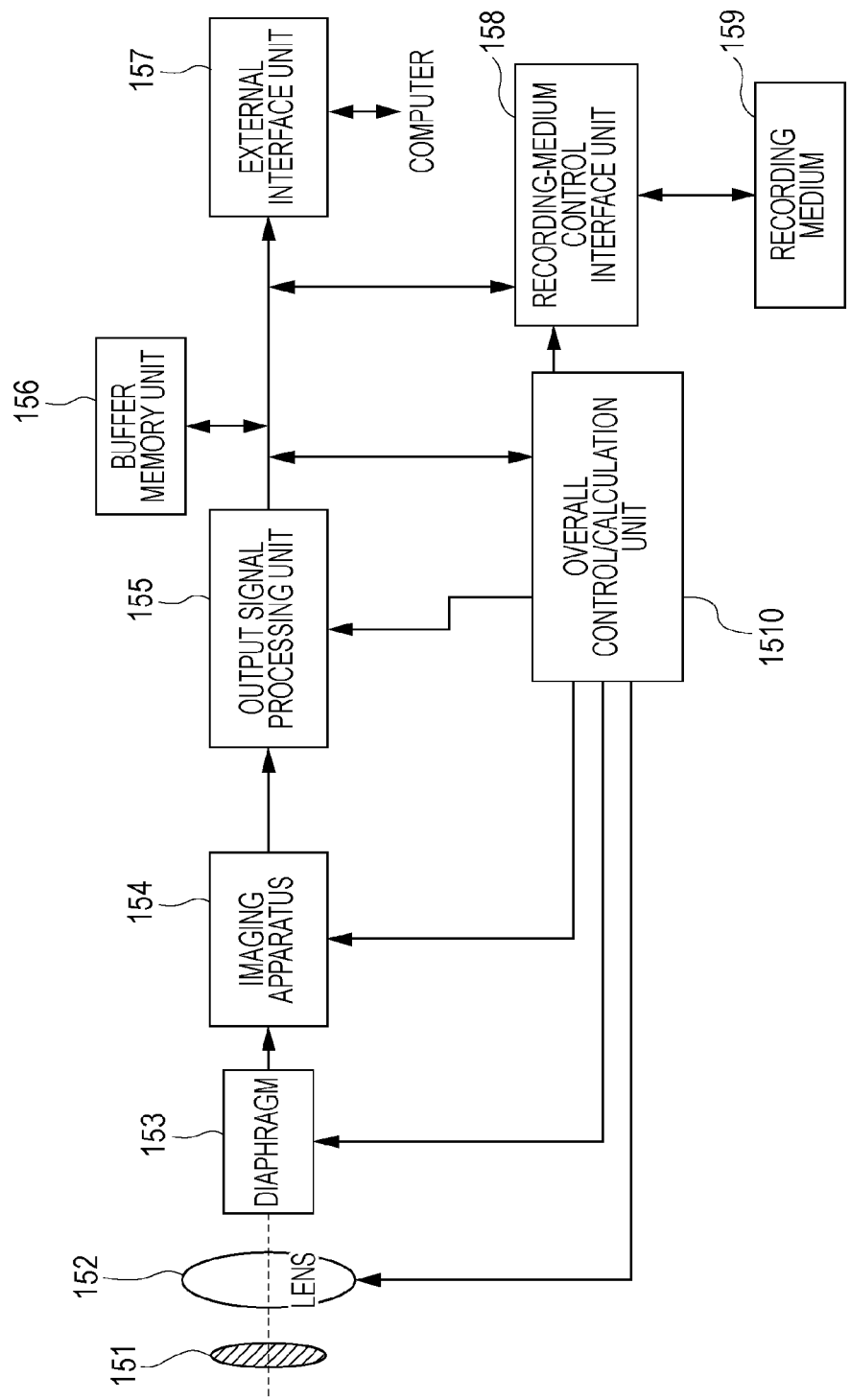
FIG. 10 is a schematic diagram of an example of an imaging system.

FIG. 10 illustrates an imaging system including an imaging apparatus according to any one of first to sixth exemplary embodiments.

Referring to FIG. 10, the imaging system includes a barrier 151 for lens protection, a lens 152 usable for focusing an optical image of an object in an imaging apparatus 154, and a diaphragm 153 usable for adjusting the quantity of light passing through the lens 152. The imaging system further includes an output signal processing unit 155 configured to process a signal output from the imaging apparatus 154. A signal output from the imaging apparatus 154 is an imaging signal usable for generating an image acquired by photographing an object. The output signal processing unit 155 generates an image by performing a correction and compression as required on an imaging signal output from the imaging apparatus 154. The lens 152 and diaphragm 153 are included in an optical system configured to condense light to the imaging apparatus 154.

The imaging system exemplarily illustrated in FIG. 10 further has a buffer memory unit 156 configured to temporarily store image data and an external interface unit 157 usable for communication with an external computer, for example. The imaging system further includes a detachably mounted recording medium 159 such as a semiconductor memory to or from which image data is recorded or read, and a recording-medium control interface unit 158 usable for recording or reading to or from the recording medium 159. The imaging system further includes an overall control/calculation unit 1510 configured to perform a calculation and control over the imaging apparatus.

The imaging apparatus 154 provided in the imaging system illustrated in FIG. 10 may have a configuration according to any one of the first to sixth exemplary embodiments. Thus, the imaging apparatus 154 in the imaging system in FIG. 10 may also provide the effect according to the first to sixth exemplary embodiments.

The disclosure may provide a technology by which the accuracy of A/D conversion does not deteriorate easily.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2013-091427, filed Apr. 24, 2013 which is hereby incorporated by reference herein in its entirety.

What is claimed is:

1. An imaging apparatus comprising:
a pixel array having a plurality of electric signal output units arranged in matrix form and a plurality of A/D conversion units provided correspondingly to the electric signal output units, each of the electric signal output units outputting an electric signal based on incident electromagnetic waves, each of the A/D conversion units converting the electric signal input from the corresponding electric signal output unit to a digital signal;

a plurality of storage units provided correspondingly to columns of the electric signal output units, each of the storage units holding the corresponding digital signal;

a first signal line configured to supply a driving bias to at least one of the electric signal output units and the A/D conversion units, the first signal line extending in a column direction; and a second signal line configured to transmit the digital signal from the A/D conversion units to the storage units, the second signal line extending in the column direction, wherein the electric signal output units include a first electric signal output unit and a second electric signal output unit disposed adjacent to each other in a row direction; and the first electric signal output unit and the second electric signal output unit are provided between the second signal line corresponding to the first electric signal output unit and the second signal line corresponding to the second electric signal output unit, the first signal line corresponding to the first electric signal output unit and the first signal line corresponding to the second electric signal output unit are provided between the first electric signal output unit and the second electric signal output unit, and the second signal line corresponding to the first electric signal output unit and the second signal line corresponding to the second electric signal output unit are not provided between the first electric signal output unit and the second electric signal output unit.

2. The imaging apparatus according to claim 1, wherein the first electric signal output unit and the second electric signal output unit are provided between a plurality of first signal lines, and the second signal line is provided between the first electric signal output unit and the second electric signal output unit.

3. The imaging apparatus according to claim 1, further comprising a selection circuit on an electrical path between the second signal line and the storage unit, wherein
the storage unit has a first storage unit and a second storage unit;
the plurality of A/D conversion units are provided correspondingly to the electric signal output units of columns different from each other;
the selection circuit outputs one of digital signals of the plurality of A/D conversion units transmitted through one of the second signal line to the first storage unit; and
the selection circuit outputs another one of the digital signals of the plurality of A/D conversion units transmitted through the second signal line to the second storage unit.

4. The imaging apparatus according to claim 1, wherein the pixel array has a plurality of pixels arranged in matrix form, each of the pixels having the electric signal output unit and the A/D conversion unit.

5. The imaging apparatus according to claim 4, wherein the pixel further has an amplifier configured to output a signal generated by amplifying the electric signal to the A/D conversion unit.

6. The imaging apparatus according to claim 5, further comprising a third signal line configured to supply a driving bias to the amplifier, wherein
the electric signal output units are provided between a signal line group including the first signal line and the third signal line and the second signal line.

7. The imaging apparatus according to claim 1, wherein each of the A/D conversion units is provided correspondingly to the electric signal output units of a plurality of rows.

8. The imaging apparatus according to claim 7, wherein the pixel array further has a plurality of amplifiers each of which outputs a signal generated by amplifying the electric signal to the corresponding A/D conversion unit;
one or a plurality of the amplifiers is provided correspondingly to one of the A/D conversion units provided correspondingly to the electric signal output units of the plurality of rows.

9. The imaging apparatus according to claim 8, further comprising a third signal line configured to supply a driving bias to the amplifier, wherein
the electric signal output units are provided between a signal line group including the first signal line and the third signal line and the second signal line.

10. The imaging apparatus according to claim 1, wherein each of the A/D conversion units is provided correspondingly to the electric signal output units of a plurality of rows and the electric signal output units of a plurality of columns.

11. The imaging apparatus according to claim 10, the imaging apparatus further comprising a plurality of amplifiers each configured to output a signal generated by amplifying the electric signal to the corresponding A/D conversion unit; wherein
the amplifiers are provided correspondingly to each of the A/D conversion units; and
the amplifiers are provided between the first signal line and the second signal line are provided.

12. The imaging apparatus according to claim 11, the imaging apparatus further comprising a third signal line configured to supply a driving bias to the amplifiers; wherein
the electric signal output units are provided between a signal line group including the first signal line and the third signal line and the second signal line.

13. The imaging apparatus according to claim 12, the imaging apparatus further comprising a fourth signal line configured to supply a ramp signal to the A/D conversion units, wherein:
each of the A/D conversion unit is provided correspondingly to the electric signal output units of a plurality of rows and the electric signal output units of a plurality of columns; and
each of the A/D conversion units is provided between the first signal line and the fourth signal line.

14. The imaging apparatus according to claim 1, wherein each of the A/D conversion units has a comparator configured to generate a comparison result signal indicative of a result of a comparison between a ramp signal and a signal based on the electric signal.

15. The imaging apparatus according to claim 14, the imaging apparatus further comprising:
a counter configured to generate a counter signal indicative of a count of clock signals;
a memory to which the comparison result signal is input from the comparator; and
a counter signal line configured to supply the counter signal from the counter to the memory unit, wherein the electric signal output units are provided between a signal line group including the second signal line and the counter signal line and the first signal line.

16. The imaging apparatus according to claim 15, the imaging apparatus further comprising a signal line configured to supply a driving bias to the memory, wherein
the electric signal output units are provided between a signal line group including the second signal line and the counter signal line and the signal line configured to supply a driving bias to the memory.

17. An imaging system comprising:
the imaging apparatus according to claim 1; and
a signal processing unit configured to receive signals output from the imaging apparatus.

18. An imaging apparatus comprising:
a pixel array including pixels disposed in rows and columns each pixel having a photoelectric conversion unit and an A/D converter, the A/D converter converting an electric signal output from the photoelectric conversion unit to a digital signal;
a plurality of first signal lines configured to supply a driving bias to the photoelectric conversion units, the first signal lines extending in a first direction; and
a plurality of second signal lines configured to transmit the digital signal output from the A/D converters, the second signal lines extending in the first direction, wherein
the pixels include a first pixel and a second pixel adjacent to the first pixel in a second direction, and
a distance between the first signal line corresponding to the first pixel and the first signal line corresponding to the second pixel in the second direction is shorter than a distance between the second signal line corresponding to the first pixel and the second signal line corresponding to the second pixel in the second direction.

19. The imaging apparatus according to claim 18, wherein
the second signal line corresponding to the first pixel and the second signal corresponding to the second pixel are not provided between the first pixel and the second pixel.

20. An imaging apparatus comprising:
a pixel array including pixels disposed in rows and columns, each pixel having a photoelectric conversion unit and an A/D converter, the A/D converter converting an electric signal output from the photoelectric conversion unit to a digital signal;
a plurality of first signal lines configured to supply a driving bias to the photoelectric conversion units, the first signal lines extending in a first direction; and
a plurality of second signal lines configured to transmit the digital signal output from the A/D converters, the second signal lines extending in the first direction, wherein
the pixels include a first pixel and a second pixel adjacent to the first pixel in a second direction,
the first pixel and the second pixels are provided between the second signal line corresponding to the first pixel and the second signal corresponding to the second pixel, and
the second signal line corresponding to the first pixel and the second signal corresponding to the second pixel are not provide between the first pixel and the second pixel.

21. The imaging apparatus according to claim 20, wherein a distance between the first signal line corresponding to the first pixel and the first signal line corresponding to the second pixel is shorter than a distance between the second signal line corresponding to the first pixel and the second signal corresponding to the second pixel.

22. An imaging apparatus comprising:
a pixel array including pixels disposed in rows and columns, each pixel having a photoelectric conversion unit and an A/D converter, the A/D converter converting an electric signal output from the photoelectric conversion unit to a digital signal;
a plurality of first signal lines configured to supply a driving bias to the A/D converters, the first signal lines extending in a first direction; and
a plurality of second signal lines configured to transmit the digital signals output from the A/D converters, the second signal lines extending in the first direction,
wherein the pixels include a first pixel and a second pixel adjacent to the first pixel in a second direction, and
a distance between the first signal line corresponding to the first pixel and the first signal line corresponding to the second pixel in the second direction is shorter than a distance between the second signal line corresponding to the first pixel and the second signal line corresponding to the second pixel in the second direction.

23. The imaging apparatus according to claim 22, wherein the second signal line corresponding to the first pixel and the second signal corresponding to the second pixel are not provided between the first pixel and the second pixel.

24. An imaging apparatus comprising:
a pixel array including pixels disposed in rows and columns, each pixel having a photoelectric conversion unit and an A/D converter, the A/D converter converting an electric signal output from the photoelectric conversion unit to a digital signal;
a plurality of first signal lines configured to supply a driving bias to the A/D converters, the first signal lines extending in a first direction; and
a plurality of second signal lines configured to transmit the digital signals output from the A/D converters, the second signal lines extending in the first direction,
wherein the pixels include a first pixel and a second pixel adjacent to the first pixel in a second direction,
the first pixel and the second pixels are provided between the second signal line corresponding to the first pixel and the second signal corresponding to the second pixel, and the second signal line corresponding to the first pixel and the second signal corresponding to the second pixel are not provide between the first pixel and the second pixel.

25. The imaging apparatus according to claim 24, wherein a distance between the first signal line corresponding to the first pixel and the first signal line corresponding to the second pixel is shorter than a distance between the second signal line corresponding to the first pixel and the second signal corresponding to the second pixel.

* * * * *